(12) United States Patent
Takemura

(10) Patent No.: US 9,941,461 B2
(45) Date of Patent: Apr. 10, 2018

(54) ELECTRONIC COMPONENT ELEMENT AND COMPOSITE MODULE INCLUDING THE SAME

(71) Applicant: Murata Manufacturing Co., Ltd., Nagaokakyo-shi, Kyoto-fu (JP)

(72) Inventor: Tadaji Takemura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 925 days.

(21) Appl. No.: 14/445,474

(22) Filed: Jul. 29, 2014

(65) Prior Publication Data

US 2014/0333175 A1   Nov. 13, 2014

Related U.S. Application Data

(63) Continuation of application No. PCT/JP2013/051722, filed on Jan. 28, 2013.

(30) Foreign Application Priority Data

Feb. 14, 2012  (JP) ................. 2012-029265

(51) Int. Cl.
| | |
|---|---|
| *H03H 9/25* | (2006.01) |
| *H01L 41/053* | (2006.01) |
| *H03H 9/10* | (2006.01) |
| *H01L 23/31* | (2006.01) |

(Continued)

(52) U.S. Cl.
CPC ........ *H01L 41/0533* (2013.01); *B81B 7/0051* (2013.01); *H01L 23/3121* (2013.01); *H01L 23/3128* (2013.01); *H03H 9/1071* (2013.01); *H01L 23/3677* (2013.01); *H01L 2924/0002* (2013.01)

(58) Field of Classification Search
CPC ............ H01L 41/0533; H01L 23/3121; H01L 23/3128; B81B 7/0051; H03H 9/1071
USPC ................ 310/340, 344, 348, 313 R, 331 R
See application file for complete search history.

(56) References Cited

U.S. PATENT DOCUMENTS

| | | |
|---|---|---|
| 2006/0131998 A1 | 6/2006 | Aoki et al. |
| 2007/0138635 A1 | 6/2007 | Ikumo et al. |
| 2008/0174207 A1 | 7/2008 | Tsuda et al. |

(Continued)

FOREIGN PATENT DOCUMENTS

| | | |
|---|---|---|
| JP | 11-312949 A | 11/1999 |
| JP | 2006-197554 A | 7/2006 |

(Continued)

OTHER PUBLICATIONS

Official Communication issued in corresponding International Application PCT/JP2013/051722, dated Apr. 16, 2013.

*Primary Examiner* — Thomas Dougherty
(74) *Attorney, Agent, or Firm* — Keating & Bennett, LLP

(57) ABSTRACT

An electronic component element includes a piezoelectric substrate and a comb-shaped electrode located on one principal surface of the piezoelectric substrate. A support layer is arranged around the comb-shaped electrode. A cover layer is disposed so as to cover the support layer and the comb-shaped electrode. Via-hole electrodes extend through the cover layer and are connected to the comb-shaped electrode. An uneven portion is located on a principal surface of the cover layer that is opposite to a principal surface of the cover layer that is opposed to the comb-shaped electrode.

18 Claims, 4 Drawing Sheets

(51) Int. Cl.
  *B81B 7/00* (2006.01)
  *H01L 23/367* (2006.01)

(56) References Cited

U.S. PATENT DOCUMENTS

| | | | |
|---|---|---|---|
| 2010/0225202 A1 | 9/2010 | Fukano et al. | |
| 2010/0289600 A1* | 11/2010 | Takada | H03H 9/0523 |
| | | | 333/193 |
| 2010/0327694 A1* | 12/2010 | Omote | H03H 9/1092 |
| | | | 310/313 R |

FOREIGN PATENT DOCUMENTS

| | | | | |
|---|---|---|---|---|
| JP | 2006-270170 A | 10/2006 | | |
| JP | 2007-173415 A | 7/2007 | | |
| JP | 2008-182292 A | 8/2008 | | |
| JP | 2008-227748 A | 9/2008 | | |
| JP | 2010-193487 A | 9/2010 | | |
| JP | 2010225943 A * | 10/2010 | | H01L 23/12 |
| WO | WO-03054957 A2 * | 7/2003 | | H01L 23/31 |
| WO | 2009/057699 A1 | 5/2009 | | |
| WO | 2009/104438 A1 | 8/2009 | | |
| WO | 2009/116222 A1 | 9/2009 | | |
| WO | 2011/136070 A1 | 11/2011 | | |

* cited by examiner

ELECTRONIC COMPONENT ELEMENT AND COMPOSITE MODULE INCLUDING THE SAME

BACKGROUND OF THE INVENTION

1. Field of the Invention

The present invention relates to an electronic component element and a composite module including the same, and particularly relates to, for example, a surface acoustic wave filter and a front-end module including the same.

2. Description of the Related Art

Japanese Unexamined Patent Application Publication No. 2008-227748 describes a surface acoustic wave (SAW) filter (hereinafter, referred to as SAW filter) in which a principal surface side of a piezoelectric substrate having a comb-shaped electrode (IDT: Interdigital Transducer) formed thereon is a mounted surface to a board. In the SAW filter, a resin sealing layer made of a resin is provided on an upper surface of the comb-shaped electrode, and a through (via-hole) electrode is formed so as to extend through the resin sealing layer for connecting the comb-shaped electrode to a bump electrode formed on the surface of the resin sealing layer. For a composite module including the SAW filter described in Japanese Unexamined Patent Application Publication No. 2008-227748, there is particularly a strong demand for height reduction, and the SAW filter also has a feature that its thickness can be decreased by the thickness of a package substrate required in the related art, since it has the structure as described in Japanese Unexamined Patent Application Publication No. 2008-227748.

However, in the SAW filter described in Japanese Unexamined Patent Application Publication No. 2008-227748, since the resin sealing layer having a different coefficient of linear expansion from that of the piezoelectric substrate is formed near the piezoelectric substrate, the resin contracts in heating and curing the resin sealing layer. When the resin contracts, compressive stress generated at the time of the contraction is applied to the piezoelectric substrate via the through electrode and the board may be deformed. When the piezoelectric substrate is deformed, the interval of the comb-shaped electrode on the piezoelectric substrate or the like is changed and thus there is the problem that the characteristics of the SAW filter are changed.

SUMMARY OF THE INVENTION

Therefore, preferred embodiments of the present invention provide an electronic component element which prevents changes in the characteristics of the electronic component element by improving an effect of radiating heat generated in the electronic component element and alleviating contraction stress applied to a piezoelectric substrate.

An electronic component element according to a preferred embodiment of the present invention includes a piezoelectric substrate; a comb-shaped electrode located on one principal surface of the piezoelectric substrate; a support layer located on the one principal surface of the piezoelectric substrate and around the comb-shaped electrode; a cover layer disposed so as to cover the support layer and the comb-shaped electrode; and a columnar conductor extending through the cover layer and connected to the comb-shaped electrode. An uneven portion is provided on a principal surface of the cover layer that is opposite to a principal surface of the cover layer that is opposed to the comb-shaped electrode.

In addition, in the electronic component element according to a preferred embodiment of the present invention, the columnar conductor preferably extends through the support layer.

Furthermore, in the electronic component element according to a preferred embodiment of the present invention, preferably, the cover layer has a stacked structure including a plurality of cover layers formed from resins having different strengths, and the resin used for the cover layer at a piezoelectric substrate side, of the cover layers, is formed from a material having high deflection strength.

Moreover, in the electronic component element according to a preferred embodiment of the present invention, the uneven portion is preferably provided only on a surface of the cover layer near the columnar conductor.

A composite module according to another preferred embodiment to the present invention includes a mounting board; the electronic component element according to one of the above-described preferred embodiments of the present invention, mounted on one principal surface of the mounting board; a mounting electrode located on the one principal surface of the mounting board; and a module cover made of a molded resin and arranged on the mounting board to cover the electronic component element. The electronic component element and the mounting board are connected to each other via the mounting electrode, and the uneven portion and the mold resin adhere to each other.

According to the electronic component element according to a preferred embodiment of the present invention, since the uneven portion is located on the surface of the cover layer of the electronic component element that is opposite to the surface thereof that is opposed to the comb-shaped electrode, it is possible to increase the surface area of the cover layer, and thus it is possible to obtain an electronic component element having an improved effect of radiating heat generated in the piezoelectric substrate of the electronic component element.

In addition, in the electronic component element according to a preferred embodiment of the present, the columnar conductor is arranged so as to extend through the support layer, and thus it is possible to obtain an electronic component element having a further improved effect of radiating generated heat in the columnar conductor which heat is transmitted from the piezoelectric substrate.

Furthermore, in the electronic component element according to a preferred embodiment of the present invention, the cover layer has a stacked structure with a plurality of cover layers made of resins having different strengths, and the resin used for the cover layer at the piezoelectric substrate side, of the cover layers, is made of a material having high deflection strength. Thus, it is possible to obtain an electronic component element which is able to significantly reduce or prevent warpage or contraction of the piezoelectric substrate due to a change in temperature.

Moreover, in the electronic component element according to a preferred embodiment of the present invention, the uneven portion is located only on the surface of the cover layer near the columnar conductor. Thus, it is possible to obtain an electronic component element having a further improved effect of radiating heat transmitted from the piezoelectric substrate of the electronic component element to the columnar conductor.

According to the composite module according to a preferred embodiment of the present invention, since the electronic component element according to a preferred embodiment of the present invention is mounted on the mounting board and the module cover covers the electronic component element, the uneven portion located on the cover layer of the electronic component element and the mold resin of the module cover adhere to each other, and thus it is possible to enhance mounting strength of the electronic component element with respect to the mounting board.

According to various preferred embodiments of the present invention, an electronic component element is obtained which prevents changes in the characteristics of the electronic component element by improving an effect of radiating heat generated in the electronic component element and alleviating contraction stress applied to a piezoelectric substrate.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 1A and 1B are schematic cross-sectional views showing an example of a first preferred embodiment of an electronic component element according to the present invention, in which FIG. 1A is a schematic cross-sectional view of an electronic component element according to the first preferred embodiment and FIG. 1B is a schematic cross-sectional view showing a portion of a composite module in which the electronic component element according to the first preferred embodiment is mounted on a mounting board.

FIGS. 2A and 2B are schematic cross-sectional views showing an example of a second preferred embodiment of the electronic component element according to the present invention, in which FIG. 2A is a schematic cross-sectional view of an electronic component element according to the second preferred embodiment and FIG. 2B is a schematic cross-sectional view showing a portion of a composite module in which the electronic component element according to the second preferred embodiment is mounted on a mounting board.

FIGS. 3A and 3B are schematic cross-sectional views showing an example of a third preferred embodiment of the electronic component element according to the present invention, in which FIG. 3A is a schematic cross-sectional view of an electronic component element according to the third preferred embodiment and FIG. 3B is a schematic cross-sectional view showing a portion of a composite module in which the electronic component element according to the third preferred embodiment is mounted on a mounting board.

DETAILED DESCRIPTION OF THE PREFERRED EMBODIMENTS

Figure 1A:
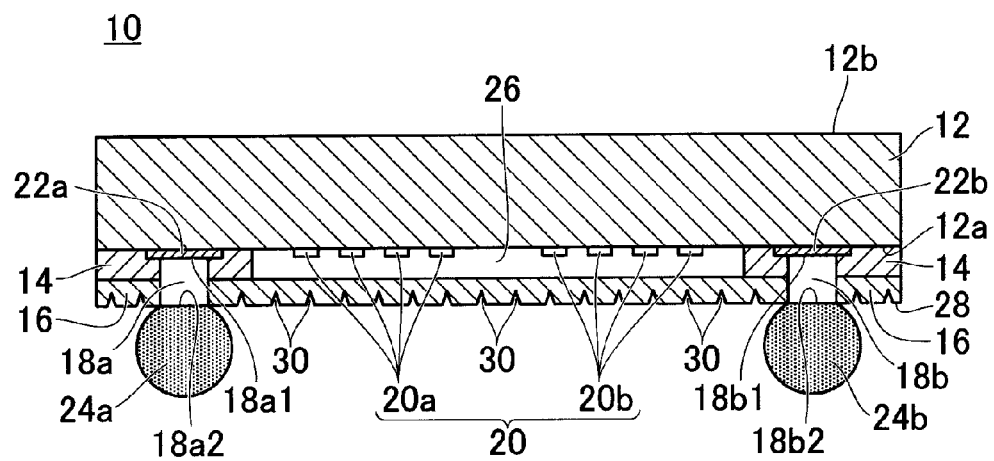
Figure 1B:
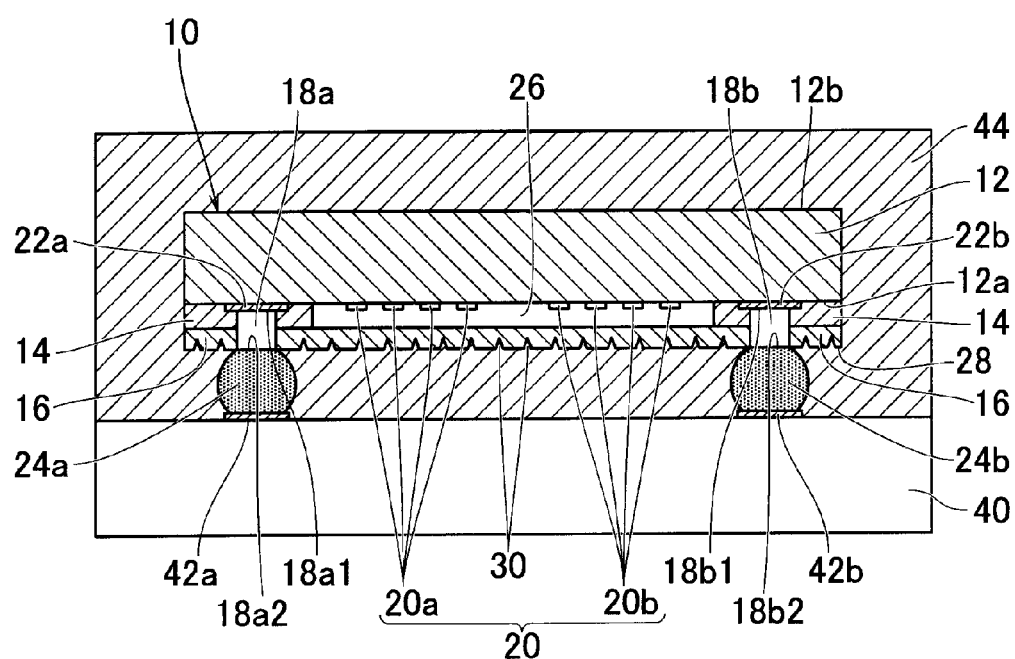

FIGS. 1A and 1B are schematic cross-sectional views showing an example of a first preferred embodiment of an electronic component element according to the present invention, in which FIG. 1A is a schematic cross-sectional view of an electronic component element according to the first preferred embodiment and FIG. 1B is a schematic cross-sectional view of a portion of a composite module in which the electronic component element according to the first preferred embodiment is mounted on a mounting board.

The electronic component element 10 shown in FIG. 1A includes a piezoelectric substrate 12, a support layer 14, a cover layer 16, and via-hole electrodes 18a and 18b which are columnar conductors according to a preferred embodiment of the present invention. As shown in FIG. 1B, the electronic component element 10 is mounted, for example, via mounting electrodes 42 located on a mounting board 40. The electronic component element 10 is a surface acoustic wave element such as an SAW filter, an SAW duplexer, or the like, or MEMS (Micro Electro Mechanical Systems), or the like.

The piezoelectric substrate 12 preferably is formed, for example, in a rectangular or substantially rectangular plate shape. The piezoelectric substrate 12 includes one principal surface 12a and another principal surface 12b. A comb-shaped electrode 20 is located on the one principal surface 12a. The comb-shaped electrode 20 includes an input comb-shaped electrode 20a and an output comb-shaped electrode 20b. For example, lithium tantalite ($LiTaO_3$), lithium niobate ($LiNbO_3$), or quartz ($SiO_2$) preferably is used as the material of the piezoelectric substrate 12. In addition, terminal electrodes 22a and 22b are located on the one principal surface 12a. The terminal electrode 22a is electrically connected to the input comb-shaped electrode 20a. In addition, the terminal electrode 22b is electrically connected to the output comb-shaped electrode 20b. For example, Cu or Ni is preferably used as the material of the terminal electrodes 22a and 22b. Furthermore, the support layer 14 is arranged on the one principal surface 12a and around the comb-shaped electrode 20.

One end 18a1 of the via-hole electrode 18a is electrically connected to the terminal electrode 22a. In addition, one end 18b1 of the via-hole electrode 18b is electrically connected to the terminal electrode 22b. The via-hole electrodes 18a and 18b are arranged so as to extend through the support layer 14 and the cover layer 16 made of a later-described resin. The via-hole electrodes 18a and 18b also are configured to radiate heat generated in the piezoelectric substrate 12, via the via-hole electrodes 18a and 18b to the mounting board 40 side. A connection electrode 24a is electrically connected to another end 18a2 of the via-hole electrode 18a. In addition, a connection electrode 24b is electrically connected to another end 18b2 of the via-hole electrode 18b. It should be noted that a bump electrode preferably made of a conductive paste, a plating, or the like, a metal pin, or the like is used as the material of the via-hole electrodes 18a and 18b.

The connection electrodes 24a and 24b preferably are defined by, for example, bump electrodes. For example, Sn, Ag, or Cu is preferably used as the material of the connection electrodes 24a and 24b. It should be noted that in FIG. 1, the connection electrodes 24a and 24b are illustrated, but the present invention is not limited thereto and a plurality of connection electrodes 24a and a plurality of connection electrodes 24b may preferably be provided.

The support layer 14 is configured to support the later-described cover layer 16. As described above, the support layer 14 is located on the one principal surface 12a of the piezoelectric substrate 12 and around the comb-shaped electrode 20. For example, an epoxy resin, a polyimide resin, silicone, a phenolic resin, an unsaturated polyester resin, or a polyurethane resin may preferably be used as the material of the support layer 14, and a polyimide resin is particularly preferred since it has heat resistance. The cover layer 16 is arranged so as to cover the comb-shaped electrode 20 and the support layer 14.

The cover layer 16 preferably is formed, for example, in a rectangular or substantially rectangular plate shape. The cover layer 16 is opposed to the comb-shaped electrode 20 at an interval that is equal or substantially equal to the thickness of the support layer 14. Therefore, a void 26 is defined by the cover layer 16 covering the support layer 14 and a region of the one principal surface 12a of the piezoelectric substrate 12 on which the comb-shaped electrode 20 is provided. The comb-shaped electrode 20 is a portion which vibrates so as to generate surface acoustic waves. Therefore, when the void 26 is provided, it is possible to keep this function. For example, an epoxy resin, a polyimide resin, silicone, a phenolic resin, an unsaturated polyester resin, or a polyurethane resin preferably is used as the material of the cover layer 16.

In addition, an uneven portion 30 is provided on a mounted-side principal surface 28 of the cover layer 16 (a principal surface opposite to a principal surface opposed to the comb-shaped electrode 20). The uneven portion 30 is preferably provided on the entirety of the mounted-side principal surface of the cover layer 16. The uneven portion 30 includes projections and recesses preferably formed by roughly processing the mounted-side principal surface 28 such that the surface area of the mounted-side principal surface 28 is increased. Such an uneven portion 30 is preferably formed, for example, by a single-side grinding machine, a sandblaster, etching, or the like. It should be noted that the uneven portion 30 may be provided at least between the connection electrode 24a and the connection electrode 24b in the form of at least one line (slit).

In the electronic component element 10 according to the present preferred embodiment, since the uneven portion 30 is provided on the mounted-side principal surface 28 of the cover layer 16 (the principal surface opposite to the principal surface opposed to the comb-shaped electrode 20), it is possible to increase the surface area of the mounted-side principal surface 28 of the cover layer 16. Thus, it is possible to improve an effect of radiating heat generated in the piezoelectric substrate 12 of the electronic component element 10.

In addition, in the electronic component element 10 according to the present preferred embodiment, since the uneven portion 30 is provided on the mounted-side principal surface 28 of the cover layer 16, compressive stress applied due to the resin contracting when the resin of the cover layer 16 is cured is alleviated. Therefore, it is possible to prevent deformation of the piezoelectric substrate 12 due to compressive stress caused by curing of the resin. As a result, it is possible to ensure flatness of the electronic component element 10. Thus, it is possible to prevent changes in the characteristics of the electronic component element due to deformation of the piezoelectric substrate 12.

Furthermore, in the electronic component element 10 according to the present preferred embodiment, since the via-hole electrodes 18a and 18b are arranged so as to extend through the support layer 14, it is possible to increase the surface areas of the via-hole electrodes 18a and 18b. Thus, it is possible to further improve the effect of radiating heat in the via-hole electrodes 18a and 18b which heat is transmitted from the piezoelectric substrate 12.

In addition, as shown in FIG. 1B, the connection electrode 24a and the mounting electrode 42 located on one principal surface of the mounting board 40 are electrically connected to each other, the connection electrode 24b and the other mounting electrode 42 are electrically connected to each other, and the electronic component element 10 is mounted on the mounting board 40. It should be noted that the surface of each mounting electrode 42 is preferably subjected to Au plating, for example.

The mounting board 40 is, for example, a printed circuit board (PCB), a ceramic board (LTCC: Low Temperature Co-fired Ceramics), or the like. The mounting board 40 may be a single-layer board or a multilayer board. As shown in FIG. 1B, a module cover 44 is provided as necessary on a mounting surface of the mounting board 40 on which the electronic component element 10 is mounted, thus coating the electronic component element 10. For example, an epoxy resin is used as the material of a mold resin used for the module cover 44.

In the case where the electronic component element 10 is mounted on the mounting board 40 as described above, a mold resin provided to protect an electronic component element, such as a SAW filter, a SAW duplexer, or the like, which is the electronic component element 10, preferably is applied as necessary and filled between the cover layer 16 and the mounting surface of the mounting board 40. In the case where the filled mold resin and the resin of the cover layer 16 are different from each other, amounts of contraction thereof during curing are different from each other. Thus, the adhesiveness between the resins at the interval therebetween is deteriorated, and there is the problem that a gap occurs. If such a gap occurs, for example, when solder of bump electrodes which are the connection electrodes 24a and 24b is melted in mounting a SAW filter, the solder enters the gap. As a result, there is the problem that short circuit failure or the like occurs between the terminal electrodes of the SAW filter.

However, as shown in FIG. 1B, in the case where the electronic component element 10 according to a preferred embodiment of the present invention is mounted on the mounting board 40, since the uneven portion 30 is provided on the mounted-side principal surface 28 of the cover layer 16 and thus the surface area of the mounted-side principal surface 28 is increased, the adhesiveness between the mold resin used for the module cover 44 and the mounted-side principal surface 28 of the cover layer 16 is improved. Therefore, it is possible to prevent the occurrence of, for example, short circuit failure or the like between the terminal electrodes of the SAW filter as described above.

Figure 2A:
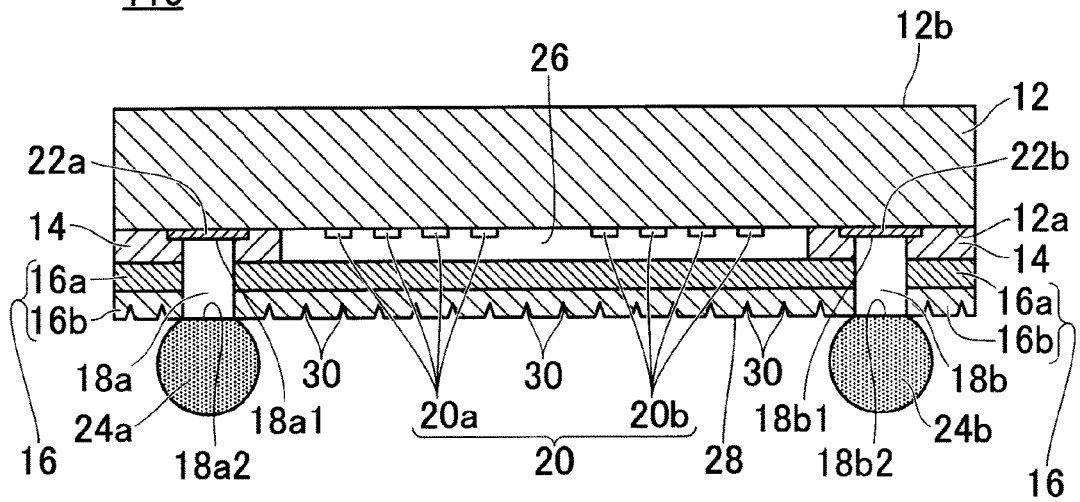
Figure 2B:
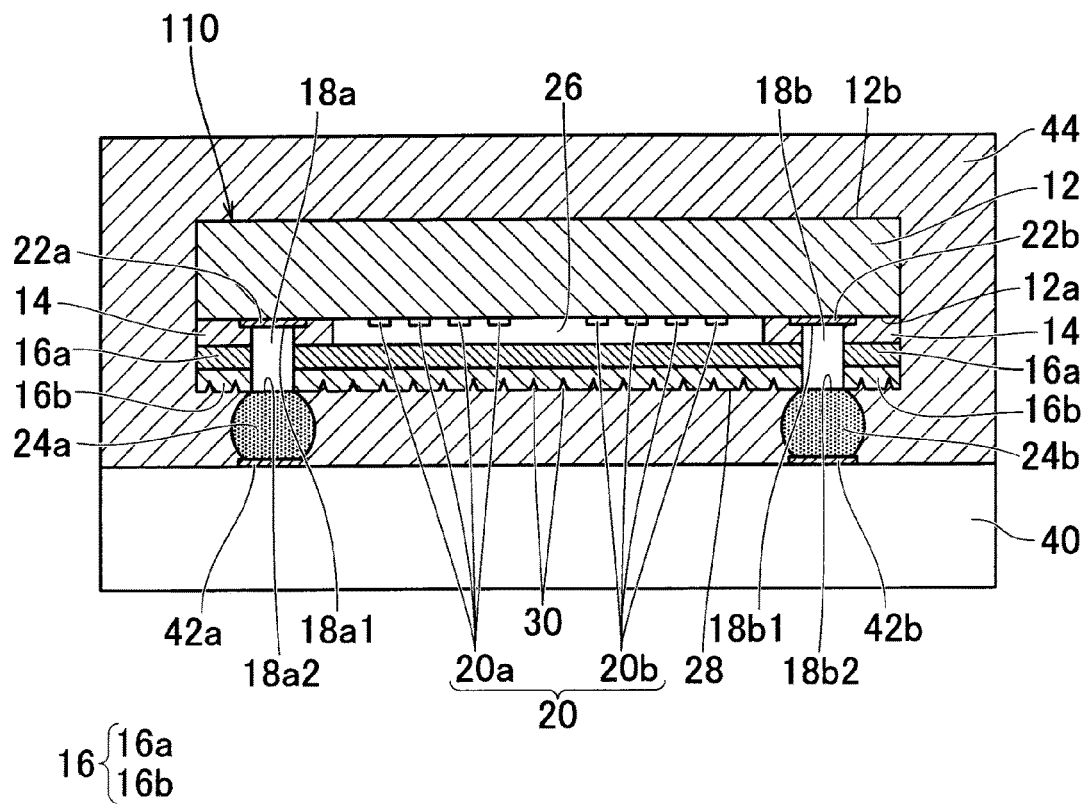

Next, a second preferred embodiment of the electronic component element according to the present invention will be described. FIGS. 2A and 2B is a schematic cross-sectional view showing an example of the second preferred embodiment of the electronic component element according to the present invention. FIG. 2A is a schematic cross-sectional view of an electronic component element according to the second preferred embodiment, and FIG. 2B is a schematic cross-sectional view showing a portion of a composite module in which the electronic component element according to the second preferred embodiment is mounted on a mounting board. It should be noted that in the present preferred embodiment, the same portions as those of the electronic component element 10 shown in FIG. 1 are designated by the same reference signs and the description thereof is omitted.

In the electronic component element 110 according to the second preferred embodiment, unlike the electronic component element 10, the cover layer 16 includes a plurality of cover layers 16 and, for example, includes a first cover layer 16a and a second cover layer 16b. The first cover layer 16a is arranged to be opposed to the one principal surface 12a of the piezoelectric substrate 12 across the void 26. In addition, the second cover layer 16b is arranged at the mounting board 40 side so as to be opposed to the mounting surface of the mounting board 40.

For example, an epoxy resin is preferably used as the material of the first cover layer 16a, and, for example, a polyimide resin is preferably used as the material of the second cover layer 16b. In other words, a material having high deflection strength with respect to the second cover layer 16b is preferably used as a material used for the first cover layer 16a, which is arranged so as to be opposed to the one principal surface 12a of the piezoelectric substrate 12.

In the electronic component element 110, not only the same advantageous effects as those in the electronic component element 10 described above but also the following advantageous effects are provided.

Specifically, in the electronic component element 110 according to the second preferred embodiment, since the first cover layer 16a, which is arranged so as to be opposed to the one principal surface 12a of the piezoelectric substrate 12, is made of a material having high deflection strength, it is possible to significantly reduce or prevent warpage or contraction of the piezoelectric substrate 12 due to a change in temperature. Thus, it is possible to improve the temperature characteristics of the electronic component element 110. In other words, since the first cover layer 16a is provided, it is possible to further reduce contraction stress of the piezoelectric substrate 12, and thus it is possible to prevent a change in filter characteristics due to deformation of the piezoelectric substrate 12.

Figure 3A:
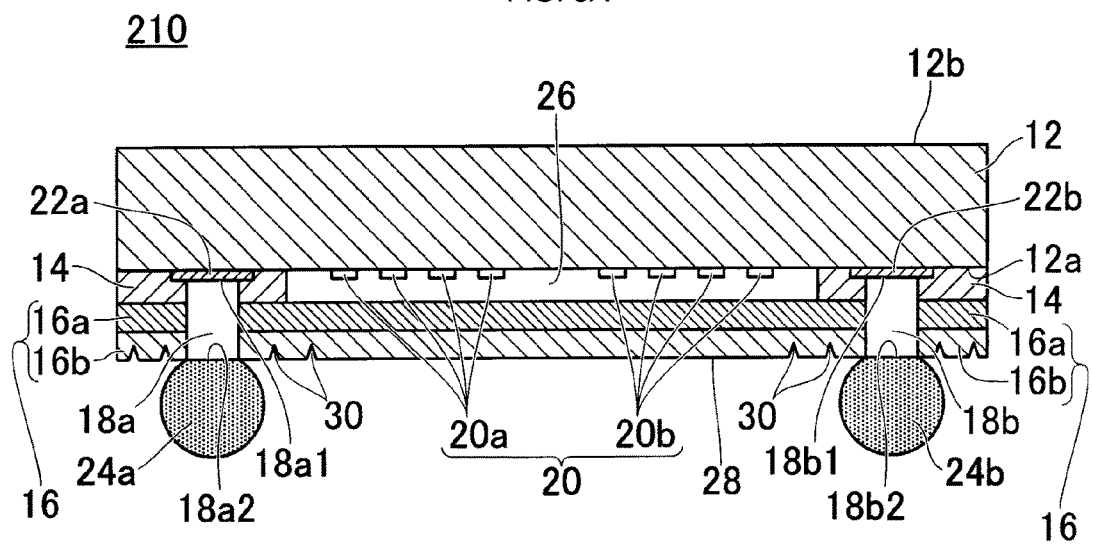
Figure 3B:
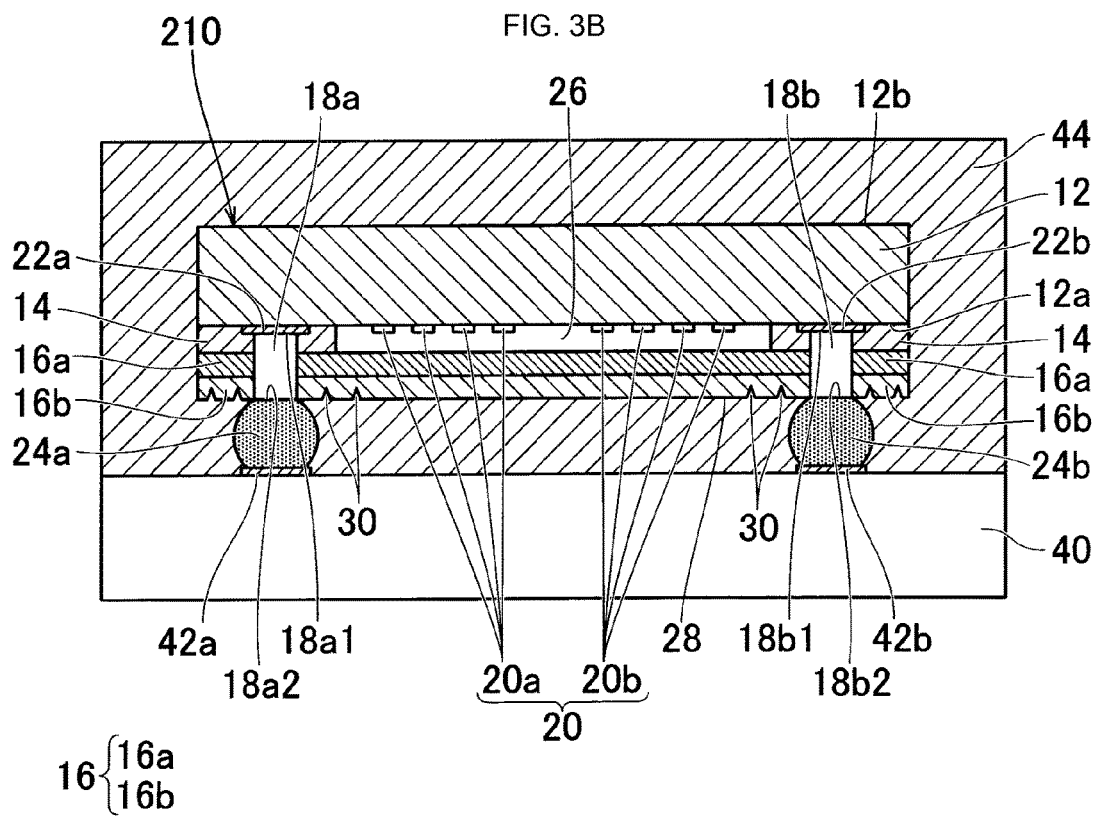

Next, a third preferred embodiment of the electronic component element according to the present invention will be described. FIGS. 3A and 3B are schematic cross-sectional views showing an example of the third preferred embodiment of the electronic component element according to the present invention. FIG. 3A is a schematic cross-sectional view of an electronic component element according to the third preferred embodiment, and FIG. 3B is a schematic cross-sectional view showing a portion of a composite module in which the electronic component element according to the third preferred embodiment is mounted on a mounting board. It should be noted that in the present preferred embodiment, the same portions as those of the electronic component element 10 shown in FIG. 1 or those of the electronic component element 110 shown in FIG. 2 are designated by the same reference signs and the description thereof is omitted.

In the electronic component element 210 according to the third preferred embodiment, unlike the electronic component element 10, the uneven portion 30 located on the mounted-side principal surface 28 of the cover layer 16 is provided only near the connection electrode 24a and the connection electrode 24b.

In the electronic component element 210 according to the third preferred embodiment, since the uneven portion 30 provided on the mounted-side principal surface 28 of the cover layer 16 is located near the connection electrode 24a and the connection electrode 24b, it is possible to further improve the effect of radiating heat transmitted from the piezoelectric substrate 12 of the electronic component element 210 to the via-hole electrodes 18a and 18b.

Figure 4:
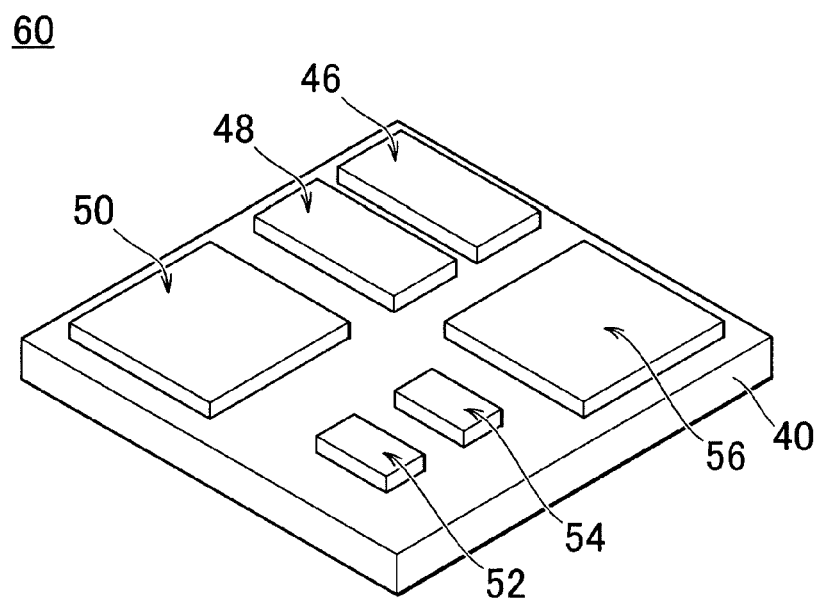
FIG. 4 is a perspective view of a front-end module, showing an example of a composite module in which the electronic component element according to a preferred embodiment of the present invention is mounted.

Next, a preferred embodiment of a composite module including the electronic component element according to one of the other preferred embodiments of the present invention will be described. FIG. 4 is a perspective view of a front-end module 60 which is an example of a composite module in which the electronic component element according to one of the other preferred embodiments of the present invention is mounted.

The front-end module 60 shown in FIG. 4 includes a mounting board 40. Mounting electrodes (not shown) are provided on the mounting surface of the mounting board 40. One or more of the electronic component elements 10, 110, and 210 according to one of the other preferred embodiments of the present invention are electrically connected via the mounting electrodes and mounted on the mounting board 40. In the present preferred embodiment, for example, a first SAW filter 46, a second SAW filter 48, and a SAW duplexer 50 are mounted as the mounted electronic component elements 10, 110, and 210 according to one of the other preferred embodiments of the present invention. Furthermore, an inductor 52, a capacitor 54, and a switch IC 56 are similarly mounted as other electronic component elements on the mounting board 40.

The mounting board 40 is, for example, a printed circuit board (PCB), a ceramic board (LTCC: Low Temperature Co-fired Ceramics), or the like. The mounting board 40 may be a single-layer board or a multilayer board. Although not shown, a molded resin is applied on the mounting surface of the mounting board 40 on which the electronic component element 10 is mounted, to define a module cover thereon. The module cover covers the first SAW filter 46, the second SAW filter 48, the SAW duplexer 50, and the other electronic component elements such as the inductor 52, the capacitor 54, the switch IC 56, and the like. Therefore, when the module cover is provided on the mounting surface of the mounting board 40, the uneven portions located on the first SAW filter 46, the second SAW filter 48, and the SAW duplexer 50 and the molded resin of the module cover adhere to each other. For example, an epoxy resin is preferably used as the material of the molded resin used for the module cover.

In the front-end module 60 according to the present preferred embodiment, when the module cover is provided on the mounting surface of the mounting board 40, the adhesiveness between the uneven portions formed on the first SAW filter 46, the second SAW filter 48, and the SAW duplexer 50 and the mold resin of the module cover is improved. Therefore, for example, it is possible to prevent the occurrence of, for example, short circuit failure or the like between the terminal electrodes of each of the first SAW filter 46, the second SAW filter 48, and the SAW duplexer 50, and it is possible to enhance the mounting strength of the respective electronic component elements 10, 110, and 210 with respect to the mounting board 40.

It should be noted that in the electronic component elements 10, 110, and 210 according to the above-described preferred embodiments, the via-hole electrodes 18a and 18b are arranged so as to extend through the support layer 14, but the present invention is not limited thereto, and the via-hole electrodes 18a and 18b may be arranged so as to extend through only the cover layer 16 that is arranged so as to cover the comb-shaped electrode 20 and the support layer 14.

In addition, in the electronic component elements 10, 110, and 210 according to the above-described preferred embodiments, the connection electrode 24a is preferably connected to the other end 18a2 of the via-hole electrode 18a and the connection electrode 24b is connected to the other end 18b2 of the via-hole electrode 18b, but the present invention is not limited thereto. Specifically, a connection electrode formed previously on the mounting electrode 42a of the mounting board may be connected to the other end 18a2 of the via-hole electrode 18a, and a connection electrode formed previously on the mounting electrode 42b of the mounting board 40 may be connected to the other end 18b2 of the via-hole electrode 18b. In this case, the uneven portion 30 may be provided on the mounted-side principal surface 28 of the cover layer 16 and at least between the other end 18a2 of the via-hole electrode 18a and the other end 18b2 of the via-hole electrode 18b and may also be provided on a portion or the entirety of the mounted-side principal surface 28.

Furthermore, in the electronic component elements 10, 110, and 210 according to the above-described preferred embodiments, the terminal electrodes 22a and 22b are provided on the one principal surface 12a of the piezoelectric substrate 12, the terminal electrode 22a and the via-hole electrode 18a are electrically connected to each other, and the terminal electrode 22b and the via-hole electrode 18b are electrically connected to each other, but the present invention is not limited thereto. Specifically, instead of forming the terminal electrodes 22a and 22b, the input comb-shaped electrode 20a and the via-hole electrode 18a, and the output comb-shaped electrode 22b and the via-hole electrode 18b may be arranged so as to be electrically connected to each other, for example, via wire electrodes provided on the one principal surface 12a of the piezoelectric substrate 12.

The electronic component element according to various preferred embodiments of the present invention is particularly useful as an electronic component element used in a wireless communication device such as a cellular phone, a wireless LAN device, or the like, and a composite module including these electronic component elements mounted thereon is suitably used. While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component element comprising:
    a piezoelectric substrate;
    a comb-shaped electrode located on one principal surface of the piezoelectric substrate;
    a support layer located on the one principal surface of the piezoelectric substrate and around the comb-shaped electrode;
    a cover layer disposed so as to cover the support layer and the comb-shaped electrode; and
    a columnar conductor extending through the cover layer and connected to the comb-shaped electrode; wherein
    an uneven portion is located on a principal surface of the cover layer that is opposite to a principal surface of the cover layer that is opposed to the comb-shaped electrode;
    the cover layer has a stacked structure including a plurality of cover layers made of resins having different strengths; and
    the resin used for the cover layer at a piezoelectric substrate side, of the cover layers, is made of a material having a deflection strength higher than others of the cover layers.

2. The electronic component element according to claim 1, wherein the columnar conductor extends through the support layer.

3. The electronic component element according to claim 1, wherein the uneven portion is located only on a surface of the cover layer near the columnar conductor.

4. The electronic component element according to claim 1, wherein the electronic component element is one of a surface acoustic wave element and a micro electro mechanical systems element.

5. The electronic component element according to claim 1, further comprising via holes extending through the support layer and the cover layer and configured to radiate heat generated in the piezoelectric substrate.

6. The electronic component element according to claim 1, wherein a void is defined by the cover layer covering the support layer and a region of the one principal surface of the piezoelectric substrate on which a comb-shaped electrode is provided.

7. The electronic component element according to claim 1, wherein the uneven portion is located at an entirety of a mounted-side principal surface of the cover layer.

8. The electronic component element according to claim 1, wherein the uneven portion includes projections and recesses.

9. The electronic component element according to claim 1, further comprising connection electrodes, wherein the uneven portion is provided as at least one line located between the connection electrodes.

10. A composite module comprising:
    a mounting board;
    the electronic component element according to claim 1, mounted on one principal surface of the mounting board;
    a mounting electrode located on the one principal surface of the mounting board; and
    a module cover made of a molded resin and arranged on the mounting board so as to cover the electronic component element; wherein
    the electronic component element and the mounting board are connected to each other via the mounting electrode; and
    the uneven portion and the mold resin are adhered to each other.

11. The composite module according to claim 10, wherein the columnar conductor extends through the support layer.

12. The composite module according to claim 10, wherein the uneven portion is located only on a surface of the cover layer near the columnar conductor.

13. The composite module according to claim 10, wherein the electronic component element is one of a surface acoustic wave element and a micro electro mechanical systems element.

14. The composite module according to claim 10, further comprising via holes extending through the support layer and the cover layer and configured to radiate heat generated in the piezoelectric substrate.

15. The composite module according to claim 10, wherein a void is defined by the cover layer covering the support layer and a region of the one principal surface of the piezoelectric substrate on which a comb-shaped electrode is provided.

16. The composite module according to claim 10, wherein the uneven portion is located at an entirety of a mounted-side principal surface of the cover layer.

17. The composite module according to claim 10, wherein the uneven portion includes projections and recesses.

18. The composite module according to claim 10, wherein the electronic component further includes connection electrodes, and the uneven portion is provided as at least one line located between the connection electrodes.

* * * * *